(12) United States Patent
Kim et al.

(10) Patent No.: US 9,142,722 B2
(45) Date of Patent: Sep. 22, 2015

(54) SEMICONDUCTOR LIGHT EMITTING DEVICE AND ILLUMINATION APPARATUS INCLUDING THE SAME

(71) Applicant: SAMSUNG ELECTRONICS CO., LTD., Suwon-si, Gyeonggi-do (KR)

(72) Inventors: Tae Woong Kim, Hwaseong-si (KR); Kyung Wook Hwang, Hwaseong-si (KR)

(73) Assignee: SAMSUNG ELECTRONICS CO., LTD., Suson-Si, Gyeonggi-Do (KR)

( * ) Notice: Subject to any disclaimer, the term of this patent is extended or adjusted under 35 U.S.C. 154(b) by 0 days.

(21) Appl. No.: 14/172,552

(22) Filed: Feb. 4, 2014

(65) Prior Publication Data

US 2014/0264254 A1    Sep. 18, 2014

(30) Foreign Application Priority Data

Mar. 15, 2013    (KR) ........................ 10-2013-0027883

(51) Int. Cl.
  *H01L 33/00*    (2010.01)
  *H01L 33/24*    (2010.01)
  *H01L 33/38*    (2010.01)

(52) U.S. Cl.
  CPC ................ *H01L 33/24* (2013.01); *H01L 33/38* (2013.01); *H01L 33/382* (2013.01); *H01L 2224/13* (2013.01)

(58) Field of Classification Search
  CPC ......... H01L 33/24; H01L 33/38; H01L 33/06; H01L 33/20; H01L 33/22
  USPC .......................... 257/79, 94, 95, 103, E33.005
  See application file for complete search history.

(56) References Cited

U.S. PATENT DOCUMENTS

| | | | |
|---|---|---|---|
| 6,818,465 B2 | 11/2004 | Biwa et al. | |
| 7,952,109 B2 | 5/2011 | Ng | |
| 8,168,455 B2 | 5/2012 | Liu et al. | |
| 2002/0117677 A1* | 8/2002 | Okuyama et al. ............... | 257/94 |
| 2008/0006831 A1* | 1/2008 | Ng ................................. | 257/79 |
| 2008/0093607 A1* | 4/2008 | Feng et al. ..................... | 257/82 |
| 2011/0198625 A1 | 8/2011 | Yoon et al. | |
| 2012/0032137 A1 | 2/2012 | Schellhammer | |
| 2012/0119237 A1 | 5/2012 | Leatherdale et al. | |
| 2012/0153252 A1 | 6/2012 | Kim et al. | |
| 2012/0161151 A1 | 6/2012 | Rana et al. | |

FOREIGN PATENT DOCUMENTS

| | | |
|---|---|---|
| KR | 10-0661716 B1 | 12/2006 |
| KR | 10-0843455 B1 | 7/2008 |

* cited by examiner

*Primary Examiner* — Minchul Yang
(74) *Attorney, Agent, or Firm* — McDermott Will & Emery LLP

(57) ABSTRACT

There is provided a light emitting device including a plurality of nanoscale light emitting structures spaced apart from one another on a first conductivity-type semiconductor base layer, the plurality of nanoscale light emitting structures each including a first conductivity-type semiconductor core, an active layer and a second conductivity-type semiconductor layer, and an electrode connected to the second conductivity-type semiconductor layer. The electrode is disposed between a first nanoscale light emitting structure and a second nanoscale light emitting structure among the plurality of nanoscale light emitting structures, and the electrode has a height lower than a height of the plurality of nanoscale light emitting structures.

20 Claims, 12 Drawing Sheets

SEMICONDUCTOR LIGHT EMITTING DEVICE AND ILLUMINATION APPARATUS INCLUDING THE SAME

CROSS-REFERENCE TO RELATED APPLICATION

This application claims the benefit of priority to Korean Patent Application No. 10-2013-0027883 filed on Mar. 15, 2013 with the Korean Intellectual Property Office, the disclosure of which is incorporated herein by reference in its entirety.

BACKGROUND

Aspects of embodiments relate to a semiconductor light emitting device and an illumination apparatus including the same.

A light emitting diode (LED), widely seen as a next generation light source, has many positive attributes such as a relatively long lifespan, relatively low power consumption, a rapid response rate, environmentally friendly characteristics, and the like, as compared to a light source according to the related art, and has been used as an important light source in various products such as illumination devices, back light units for display devices, and the like. In particular, group III nitride-based LEDs including gallium nitride (GaN)-based LEDs, aluminum gallium nitride (AlGaN)-based LEDs, indium gallium nitride (InGaN)-based LEDs, indium aluminum gallium nitride (InAlGaN)-based LEDs, and the like have been used in semiconductor light emitting devices outputting blue or ultraviolet light.

Recently, as LEDs have come into widespread use, the range of uses thereof is being broadened to encompass the field of high current, high output light sources. As described above, as LEDs are required in the field of high current, high output light sources, research into improving light emitting characteristics in the field of the present technology has continued and there have been efforts to improve growth conditions for multiple quantum well (MQW) structures and to improve the crystalline properties of semiconductor layers. In particular, in order to increase light efficiency through improvements in crystalline properties and increases in light emission regions, a light emitting device including a nanoscale light emitting structure and technology for the manufacturing thereof have been proposed.

SUMMARY

An exemplary embodiment of the inventive concept provides a semiconductor light emitting device having improved reliability by preventing a current from being concentrated on an upper part of a nanoscale light emitting structure and allowing for simultaneous emission of light in both directions, that is, upward and downward directions of a nanoscale light emitting structure, and an illumination apparatus having the same.

According to an exemplary embodiment of the inventive concept, a semiconductor light emitting device includes: a first conductivity-type semiconductor base layer; a plurality of nanoscale light emitting structures spaced apart from one another on the first conductivity-type semiconductor base layer, the plurality of nanoscale light emitting structures each including a first conductivity-type semiconductor core, an active layer and a second conductivity-type semiconductor layer; and an electrode connected to the second conductivity-type semiconductor layer. The electrode is disposed between a first nanoscale light emitting structure and a second nanoscale light emitting structure among the plurality of nanoscale light emitting structures, and the electrode has a height lower than a height of the plurality of nanoscale light emitting structures.

Upper parts of the plurality of nanoscale light emitting structures may protrude in an upward direction above the electrode.

The plurality of nanoscale light emitting structures may have inclined side portions such that upper parts of the nanoscale light emitting structures have gradually reduced cross sections, and the electrode may cover portions of the inclined side portions of the plurality of nanoscale light emitting structures.

The semiconductor light emitting device may further include a capping layer disposed on the plurality of nanoscale light emitting structures and the electrode.

At least a portion of light generated from the active layer may be emitted in an upward direction of the plurality of nanoscale light emitting structures through the capping layer.

The capping layer may include one of $SiO_2$, $SiN$, $Al_2O_3$, $HfO$, $TiO_2$ or $ZrO$.

The light generated from the active layer may be emitted in both directions, upward and downward directions of the plurality of nanoscale light emitting structures.

The semiconductor light emitting device may further include a substrate located below the first conductivity-type semiconductor base layer; and an insulating layer disposed on the first conductivity-type semiconductor base layer and having a plurality of insulator openings formed therein exposing the first conductivity-type semiconductor base layer, and the plurality of nanoscale light emitting structures may be disposed on the plurality of insulator openings.

The plurality of nanoscale light emitting structures each may have a hexagonal pyramid shape or a hexagonal prism shape.

The plurality of nanoscale light emitting structures each may have a frustum of pyramid shape extending in a single direction.

A thickness of the electrode in a region adjacent to the second conductivity-type semiconductor layer may be thicker or thinner than that of a region in a central portion of the electrode.

According to an exemplary embodiment of the inventive concept, there is provided an illumination apparatus including: a semiconductor light emitting device including a substrate; a first conductivity-type semiconductor base layer disposed on the substrate; a plurality of nanoscale light emitting structures spaced apart from one another on the first conductivity-type semiconductor base layer, the plurality of nanoscale light emitting structures each including a first conductivity-type semiconductor core, an active layer and a second conductivity-type semiconductor layer; and an electrode connected to the second conductivity-type semiconductor layer, the electrode being disposed between a first nanoscale light emitting structure and a second nanoscale light emitting structure among the plurality of nanoscale light emitting structures, the electrode having a height lower than a height of the plurality of nanoscale light emitting structures; and a mounting substrate allowing the semiconductor light emitting device to be mounted thereon, wherein the light emitted from the semiconductor light emitting device is emitted bidirectionally, upwardly and downwardly of the semiconductor light emitting device.

The illumination apparatus may further include a reflective part disposed above or below the semiconductor light emitting device and altering a path of light emitted from the semiconductor light emitting device.

The mounting substrate may be formed of a transparent material.

The semiconductor light emitting device may be vertically mounted on the mounting substrate such that the substrate is perpendicular with regard to the mounting substrate.

An exemplary embodiment of the inventive concept provides a light emitting device. The light emitting device comprises a plurality of nanoscale light emitting structures and an electrode disposed between a first nanoscale light emitting structure and a second nanoscale light emitting structure among the plurality of nanoscale light emitting structures. Each of the plurality of nanoscale light emitting structures comprises a first conductivity-type semiconductor core, an active layer, and a second conductivity-type semiconductor layer. The electrode is connected to the second conductivity-type semiconductor layer and peaks of the plurality of nanoscale light emitting structures lie above the electrode.

The plurality of nanoscale light emitting structures each may have inclined side portions such that upper parts of the plurality of nanoscale light emitting structures have triangular cross sections thereof.

Light generated from the active layer may be emitted in both upward and downward directions of the nanoscale light emitting structures.

The light emitting device may further include an insulating layer including a plurality of insulator openings, wherein the plurality of nanoscale light emitting structures are disposed on the plurality of insulator openings.

The light emitting device may further include a capping layer disposed on the plurality of nanoscale light emitting structures and the electrode.

BRIEF DESCRIPTION OF THE DRAWINGS

Exemplary embodiments of the inventive concept will be more clearly understood from the following detailed description taken in conjunction with the accompanying drawings, in which.

DETAILED DESCRIPTION OF EMBODIMENTS

Figure 1:
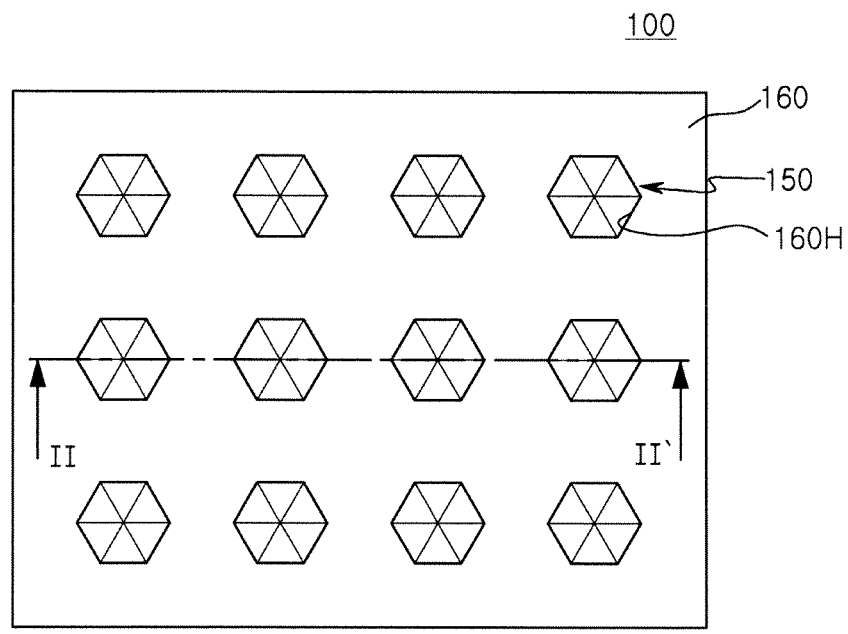
FIG. 1 is a schematic plan view of a semiconductor light emitting device having a nanoscale light emitting structure according to an exemplary embodiment of the present inventive concept.

Various exemplary embodiments will now be described in detail with reference to the accompanying drawings.

Exemplary embodiments may, however, be embodied in many different forms and should not be construed as being limited to embodiments set forth herein. Rather, these exemplary embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements.

Figure 2:
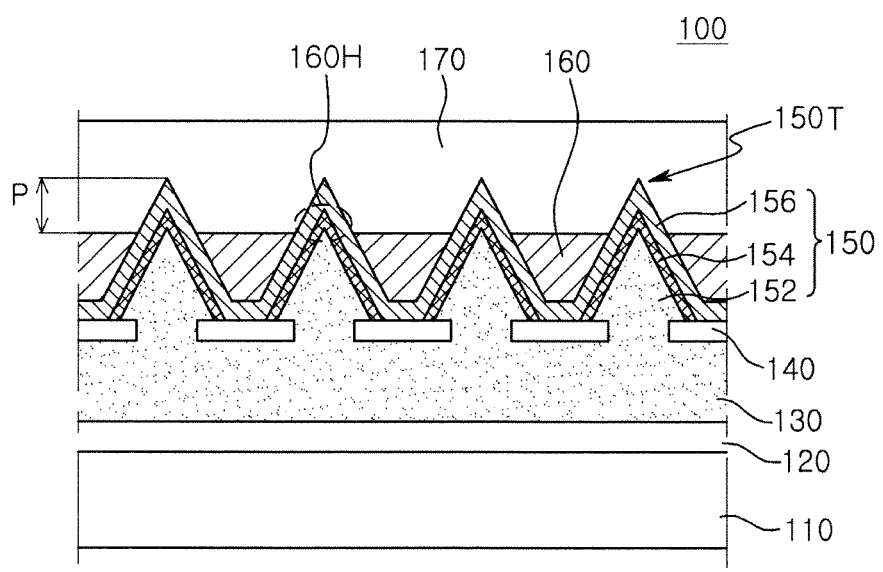
FIG. 2 is a schematic cross-sectional view of a semiconductor light emitting device taken along line II-II' of FIG. 1.

FIG. 1 is a schematic plan view of a semiconductor light emitting device having a nanoscale light emitting structure according to an exemplary embodiment of the present inventive concept. FIG. 2 is a schematic cross-sectional view of a semiconductor light emitting device taken along line II-II' of FIG. 1.

Some constituent elements of a semiconductor light emitting device may be omitted from FIGS. 1 and 2. For example, pad electrodes are omitted from the illustration of FIGS. 1 and 2, and a description of the elements omitted in the illustration will be provided below with reference to different drawings. For the purposes of illustration and simplicity, in FIG. 1 a capping layer 170 illustrated in FIG. 2 is omitted.

With reference to FIGS. 1 and 2, a semiconductor light emitting device 100 may include a substrate 110, a first conductivity-type semiconductor base layer 130 formed on the substrate 110, an insulating layer 140, a nanoscale light emitting structure 150, an electrode 160 and a capping layer 170. In the exemplary embodiment, the nanoscale light emitting structure 150 includes a first conductivity-type semiconductor core 152 grown from the first conductivity-type semiconductor base layer 130, an active layer 154 and a second conductivity-type semiconductor layer 156. The semiconductor light emitting device 100 further includes a buffer layer 120 disposed between the substrate 110 and the first conductivity-type semiconductor base layer 130.

Unless explicitly described otherwise, the terms 'upper part,' 'upper surface,' 'lower part,' 'lower surface,' 'side surface,' and the like will be used, based on the drawings, and may be changed depending on a direction in which a device is disposed.

The substrate 110 may be provided as a semiconductor growth substrate, and may be formed using an insulating, conductive semiconductor material such as sapphire, silicon carbide (SiC), $MgAl_2O_4$, MgO, $LiAlO_2$, $LiGaO_2$, GaN or the like. In the case of a sapphire substrate, sapphire may be a crystal having Hexa-Rhombo R3c symmetry, and may have respective lattice constants of 13.001 Å and 4.758 Å in c-axis and a-axis directions, and may have a C (0001) plane, an A (1120) plane, an R (1102) plane and the like. In this case, since the C plane comparatively facilitates the growth of a nitride thin film and is stable at relatively high temperatures, the C plane may be mainly used as a growth substrate for a nitride semiconductor. On the other hand, in a case in which the substrate 110 is a silicon (Si) substrate, since the Si substrate is appropriate for obtaining a substrate having a relatively large diameter and implementing slimness and lightness therein while having relatively low manufacturing costs, mass production thereof can be achieved.

The buffer layer 120 is formed on the substrate 110 to improve crystalline properties of the first conductivity-type semiconductor base layer 130. The buffer layer 120 may be formed of, for example, $Al_xGa_{1-x}N$ grown at a relatively low temperature without doping.

The first conductivity-type semiconductor base layer 130 can be formed on the substrate 110 or the buffer layer 120. The first conductivity-type semiconductor base layer 130 can be formed of a group III-V compound. For example, the first conductivity-type semiconductor base layer 130 can be formed of gallium nitride (GaN). Further, the first conductivity-type semiconductor base layer 130 can be doped with, for example, an n-type impurity, and thus the first conductivity-type semiconductor base layer 130 can be n-GaN.

In the present exemplary embodiment, the first conductivity-type semiconductor base layer 130 is commonly connected to one sides of the respective nanoscale light emitting structures 150 having common polarities, to thus serve as a contact structure on one side thereof, as well as providing a crystal plane for growth of the first conductivity-type semiconductor core 152 of the light emitting structure 150.

In the exemplary embodiment, the insulating layer 140 is formed on the first conductivity-type semiconductor base layer 130. The insulating layer 140 may be formed of a silicon oxide or a silicon nitride, for example, any one of $SiO_x$, $SiO_xN_y$, $Si_xN_y$, $Al_2O_3$, TiN, MN, ZrO, TiAlN and TiSiN, or a combination thereof. The insulating layer 140 also includes a plurality of insulator openings to which portions of the first conductivity-type semiconductor base layer 130 are exposed. A diameter, a length, a position and a growth condition of the nanoscale light emitting structure 150 may be determined depending on the size of the insulator openings. The insulator openings may have various shapes such as a circular cross-sectional shape, a quadrangular cross-sectional shape, a hexagonal cross-sectional shape, or the like. Although the plurality of insulator openings are illustrated as having the same diameter, the plurality of insulator openings may have different diameters.

The nanoscale light emitting structures 150 are respectively formed on corresponding positions of the plurality of insulator openings. The nanoscale light emitting structures 150 each have a core-shell structure including a first conductivity-type semiconductor core 152 grown from a region of the first conductivity-type semiconductor base layer 130 exposed to an insulator opening, an active layer 154 and a second conductivity-type semiconductor layer 156 sequentially formed on a surface of the first conductivity-type semiconductor core 152.

The first conductivity-type semiconductor core 152 and the second conductivity-type semiconductor layer 156 may be configured of a semiconductor doped with an n-type impurity and a p-type impurity, respectively, but are not limited thereto, and reversely, may be configured of a semiconductor doped with a p-type impurity and an n-type impurity, respectively. The first conductivity-type semiconductor core 152 and the second conductivity-type semiconductor layer 156 may be configured of a nitride semiconductor, for example, formed of a material having composition of $Al_xIn_yGa_{1-x-y}N$ ($0 \le x \le 1$, $0 \le y \le 1$, and $0 \le x+y \le 1$). Respective layers thereof may be formed as single layers, but may include a plurality of different layers having different characteristics in terms of doping concentration, composition, or the like. Further, the first conductivity-type semiconductor core 152 and the second conductivity-type semiconductor layer 156 can be formed using an AlInGaP or AlInGaAs-based semiconductor, besides a nitride semiconductor. For example, in the exemplary embodiment, the first conductivity-type semiconductor core 152 is formed of n-GaN doped with silicon (Si) or carbon (C), and the second conductivity-type semiconductor layer 156 is formed of p-GaN doped with magnesium (Mg) or zinc (Zn).

The active layer 154 is formed on a surface of the first conductivity-type semiconductor core 152. The active layer 154 emits light having a predetermined energy through recombination of electrons and holes, and may be a layer formed of a single material such as InGan or the like. Meanwhile, in a case in which the active layer 154 has a multiple quantum well (MQW) structures, in which a quantum barrier layer and a quantum well layer are alternately stacked, for example, configured of a nitride semiconductor, the active layer 154 may have a Gan/InGaN structure.

The number of nanoscale light emitting structures 150 included in the semiconductor light emitting device 100 is not limited to that illustrated in FIGS. 1 and 2, and the semiconductor light emitting device 100 may include, for example, tens of or hundreds of nanoscale light emitting structures 150. In the exemplary embodiment, the nanoscale light emitting structures 150 each have inclined side portions by which the size of a cross section thereof is reduced in a growth direction of the nanoscale light emitting structures 150. For example, each of the nanoscale light emitting structure 150 may have a polygonal pyramid shape and may have a hexagonal pyramid shape as shown in FIG. 1. However, the shape of the nanoscale light emitting structure 150 may be a pyramid shape or a cylindrical shape, or other shapes (i.e., two or more shapes combined). Further, since the nanoscale light emitting structures 150 can have a three-dimensional shape, a light emission surface area may be relative large to obtain increased light efficiency.

Further, the nanoscale light emitting structures 150 each may include a plurality of semipolar planes inclined with respect to the substrate 110 (now shown). Furthermore, when the active layer 154 is formed of InGaN, the content of indium (In) can be increased to thereby reduce a crystal defect due to a lattice mismatch and to increase internal quantum efficiency of the semiconductor light emitting device 100.

As illustrated in FIGS. 1 and 2, the electrode 160 is electrically connected to the second conductivity-type semiconductor layer 156. As for the other side electrode, the first conductivity-type semiconductor base layer 130 is electrically connected to the first conductive semiconductor core 152.

The electrode 160 may be formed on side portions of the nanoscale light emitting structures 150 between the nanoscale light emitting structures 150 such that portions of upper parts of the nanoscale light emitting structures 150 including tip regions 150T are exposed. Therefore, the electrode 160 may include a plurality of opening parts 160H having a hole shape. The nanoscale light emitting structures 150 may protrude above the electrode 160 to have a predetermined height P ("the protrusion height") through the opening parts 160H. The protrusion height P may vary according to exemplary embodiments and may be a height at which at least tip region 150T of the nanoscale light emitting structure 150 is exposed and thus light emission efficiency may be significantly increased. In the exemplary embodiment, the shape of the opening parts 160H is shown as a hexagonal shape in FIG. 1, but is not limited thereto and may be various geometric shapes.

In the exemplary embodiment, the electrode 160 may be obtained by forming a conductive material having ohmic contact characteristics with the second conductivity-type semiconductor layer 156 to have a single layer or multilayer structure. For example, the electrode 160 may contain at least one of gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt) and the like, or at least one of alloys thereof. Specifically, the electrode 160 may be formed of a light reflective material having high reflexibility, for example, an AgPdCu alloy. According to an exemplary embodiment, the electrode 160 can be a transparent electrode, and, can be formed of indium tin oxide (ITO), aluminum zinc oxide (AZO), indium zinc oxide (IZO), ZnO, ZnO:Ga (GZO), $In_2O_3$, $SnO_2$, CdO, $CdSnO_4$, or $Ga_2O_3$.

As in the exemplary embodiment, the electrode 160 is formed such that an upper part of the nanoscale light emitting structure 150 is exposed, thereby preventing a phenomenon in which a current generated in the tip region 150T while the semiconductor light emitting device 100 operates is concentrated, through a three dimensional shape of the nanoscale light emitting structure 150. An electric field formed in the tip region 150T is proportionate to an inverse of a radius of the tip region 150T, and in a case in which the nanoscale light emitting structure 150 has a pyramid shape, an electric field is rapidly changed along the tip region 150T. Thus, when the electrode 160 is formed to cover the tip region 150T, stability of a driving voltage of the semiconductor light emitting device 100 is deteriorated, and reliability of the semiconductor light emitting device 100 is degraded due to an increase in a leakage current or the like.

In the exemplary embodiment, the capping layer 170 is formed on the nanoscale light emitting structure 150 and the electrode 160. The capping layer 170 is formed of a light transmitting insulating material, and for example, may include $SiO_2$, $SiN_x$, $Al_2O_3$, HfO, $TiO_2$ or ZrO. At least a portion of light generated from the active layer 154 is emitted from the nanoscale light emitting structure 150 protruding through the electrode 160 to an upper part of the semiconductor light emitting device 100, toward the capping layer 170. In this case, the capping layer 170 provides an additional upper window for the emission of light, allowing for the simultaneous emission of light bidirectionally, in upward and downward directions of the semiconductor light emitting device 100, thereby improving the light extraction efficiency of various products.

However, the capping layer 170 of the exemplary embodiment is not limited to the light transmitting material as described above, and may also be formed of a light reflective material, and for example, may be formed of a material in which $TiO_2$, $SiO_2$, or the like is dispersed in a light transmitting resin. In such a case, light may only be emitted toward a lower part of the substrate 110.

The capping layer 170 may also perform a function of protecting the nanoscale light emitting structures 150, and a thickness of the capping layer 170 is not limited to the thickness thereof depicted in the drawing.

The semiconductor light emitting device 100, according to the exemplary embodiment, may prevent a current concentration phenomenon occurring in the tip region 150T by employing a structure in which the electrode 160 is formed on a slope of the nanoscale light emitting structure 150 while increasing light efficiency through a three dimensional shape of the nanoscale light emitting structure 150. In addition, the semiconductor light emitting device 100 may have two light emission surfaces of upper and lower parts.

Figure 3:
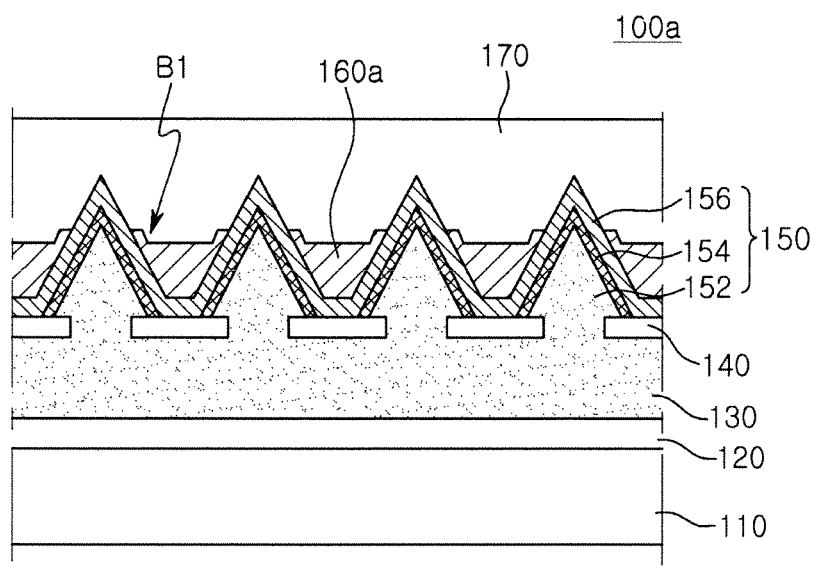
FIGS. 3 and 4 are schematic cross-sectional views of a semiconductor light emitting device having a nanoscale light emitting structure according to an exemplary embodiment.
Figure 4:
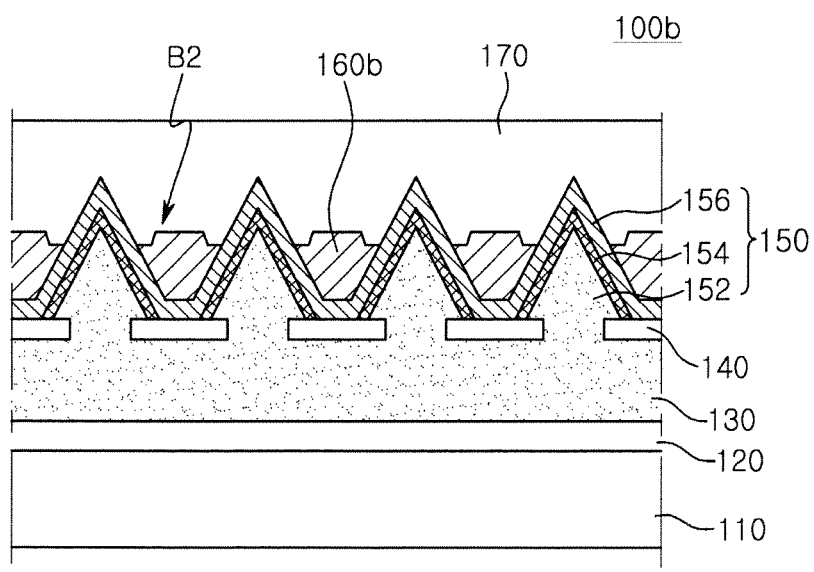

FIGS. 3 and 4 are schematic cross-sectional views of a semiconductor light emitting device having a nanoscale light emitting structure according to an exemplary embodiment.

With reference to FIGS. 3 and 4, the semiconductor light emitting device 100a or 100b includes a substrate 110, a first conductivity-type semiconductor base layer 130 formed on the substrate 110, an insulating layer 140, a nanoscale light emitting structure 150, an electrode 160a or 160b, and a capping layer 170. The nanoscale light emitting structure 150 includes a first conductivity-type semiconductor core 152 grown from the first conductivity-type semiconductor base layer 130, an active layer 154 and a second conductivity-type semiconductor layer 156.

The electrode 160a or 160b is electrically connected to the second conductivity-type semiconductor layer 156. Further, an upper surface of the electrode 160a or 160b includes a bent (or raised step) portion B1 or B2 unlike the semiconductor light emitting device 100 of FIGS. 1 and 2.

As shown in FIG. 3, the electrode 160a has the bent portion B1 formed thereon such that a side portion of the electrode 160a contacting the nanoscale light emitting structure 150 may be thicker than a central portion of the electrode 160a. In addition, as shown in FIG. 4, the electrode 160b has the bent portion B2 such that a side portion thereof contacting the nanoscale light emitting structure 150 is thinner than a central portion thereof.

Such a shape of the electrode 160a or 160b can be formed based on a change in a manufacturing method, and a size of a step between an upper surface and a lower surface of the electrode is not limited to the illustration of FIGS. 3 and 4.

Figure 5:
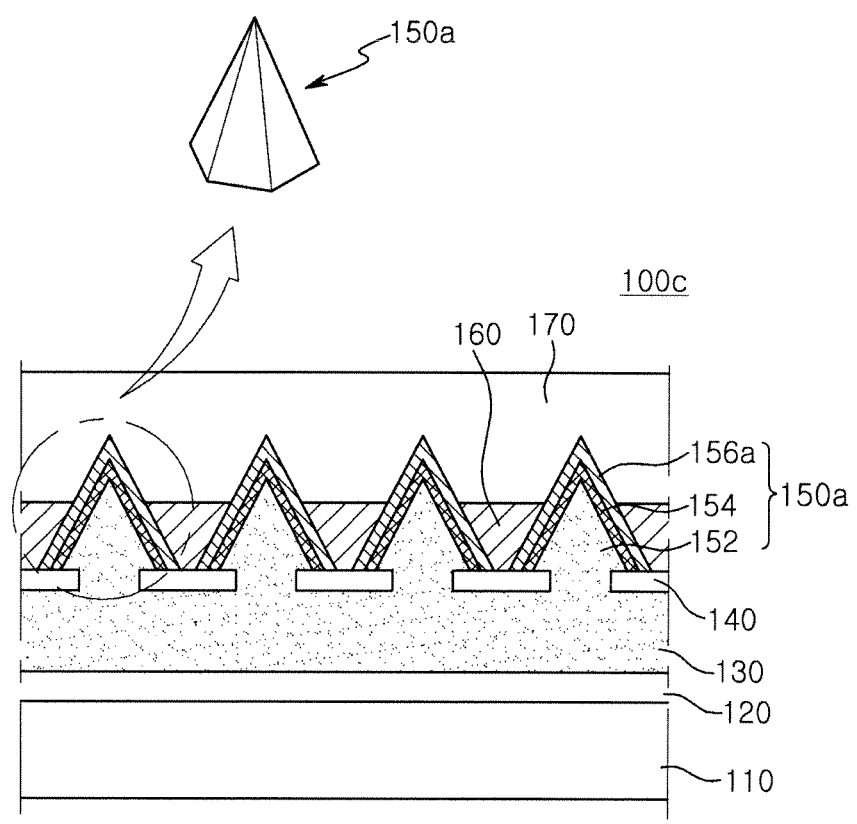
FIG. 5 is a schematic cross-sectional view of a semiconductor light emitting device having a nanoscale light emitting structure according to an exemplary embodiment.

FIG. 5 is a schematic cross-sectional view of a semiconductor light emitting device having a nanoscale light emitting structure according to an exemplary embodiment.

With reference to FIG. 5, a semiconductor light emitting device 100c includes a substrate 110, a first conductivity-type semiconductor base layer 130 formed on the substrate 110, an insulating layer 140, a nanoscale light emitting structure 150a, an electrode 160, and a capping layer 170. The nanoscale light emitting structure 150a includes a first conductivity-type semiconductor core 152 grown from the first conductivity-type semiconductor base layer 130, an active layer 154 and a second conductivity-type semiconductor layer 156a.

The second conductivity-type semiconductor layer 156a according to the exemplary embodiment may be formed to have a relatively thin thickness unlike the semiconductor light emitting device 100 shown in FIGS. 1 and 2, to have a form in which a central portion of the insulating layer 140 is not entirely covered therewith. The nanoscale light emitting structure 150a may have a hexagonal pyramid shape like the semiconductor light emitting device 100 of FIGS. 1 and 2.

Figure 6:
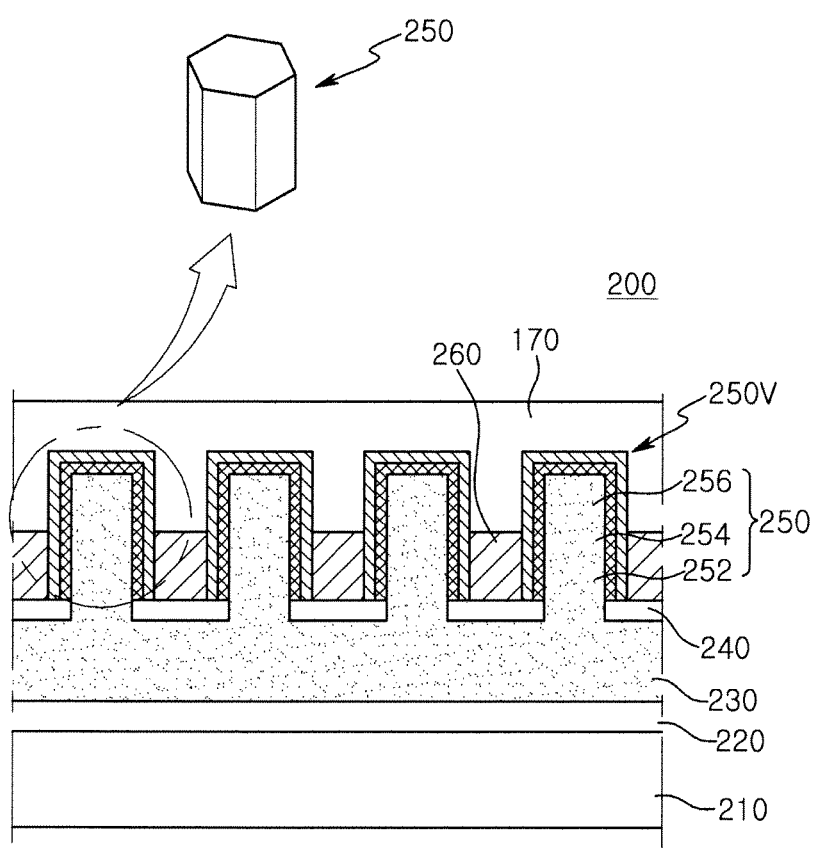
FIG. 6 is a schematic cross-sectional view of a semiconductor light emitting device having a nanoscale light emitting structure according to an exemplary embodiment.

FIG. 6 is a schematic cross-sectional view of a semiconductor light emitting device having a nanoscale light emitting structure according to an exemplary embodiment.

With reference to FIG. 6, a semiconductor light emitting device 200 may include a substrate 210, a first conductivity-type semiconductor base layer 230 formed on the substrate 210, an insulating layer 240, a nanoscale light emitting structure 250, an electrode 260, and a capping layer 270. The nanoscale light emitting structure 250 includes a first conductivity-type semiconductor core 252 grown from the first conductivity-type semiconductor base layer 230, an active layer 254 and a second conductivity-type semiconductor layer 256. The semiconductor light emitting device 200 further includes a buffer layer 220 disposed between the substrate 210 and the first conductivity-type semiconductor base layer 230.

In the exemplary embodiment, the nanoscale light emitting structure 250 has a rod form, unlike the semiconductor light emitting device 100 of FIGS. 1 and 2, and specifically, can have a hexagonal prism shape as shown in FIG. 6.

The electrode 260 is electrically connected to the second conductivity-type semiconductor layer 256 and may be formed to have a height lower than those of the nanoscale light emitting structures 250, between the nanoscale light emitting structures 250. Thus, the nanoscale light emitting structures 250 protrude upwardly of the electrode 260 by a predetermined distance.

As in the exemplary embodiment shown in FIG. 6, the electrode 260 is formed to expose upper parts of the nanoscale light emitting structures 250, thereby preventing a current concentration phenomenon occurring in vertex regions 250V of the upper parts of the nanoscale light emitting structures 250 due to a three dimensional shape of the nanoscale light emitting structures.

Figure 7:
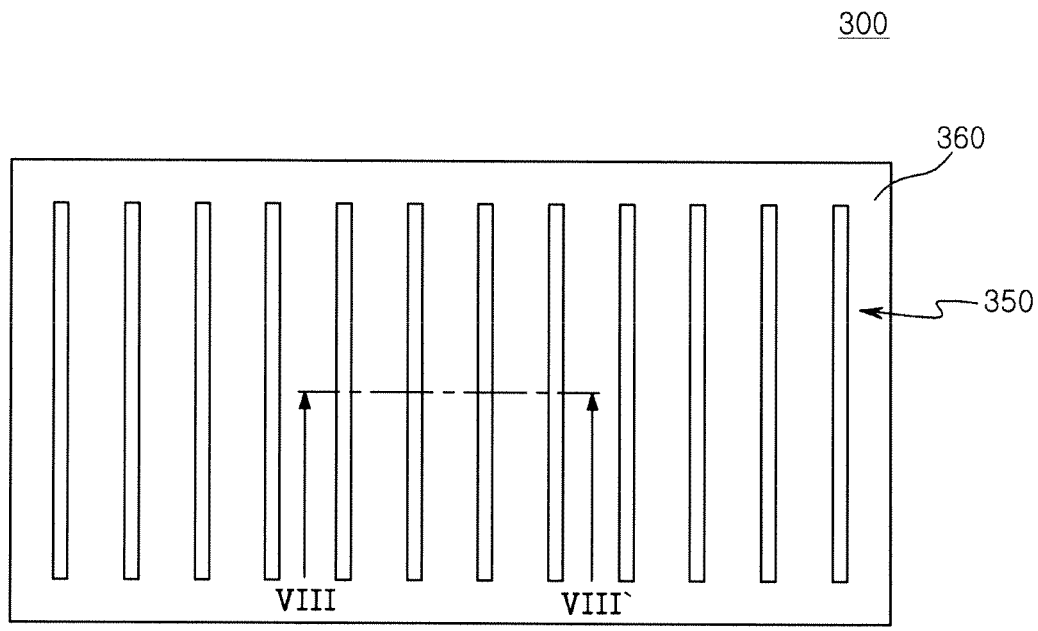
FIG. 7 is a plan view schematically illustrating a semiconductor light emitting device including a nanoscale light emitting structure according to an exemplary embodiment.
Figure 8:
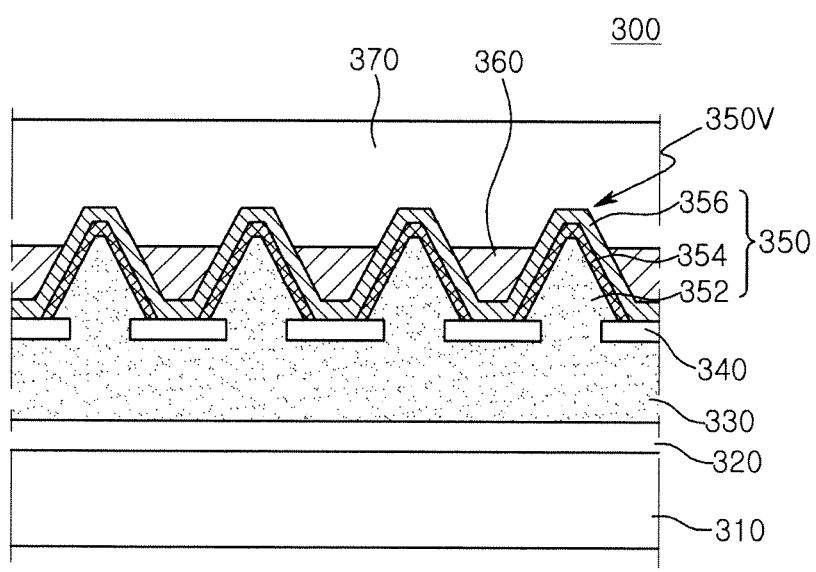
FIG. 8 is a schematic cross-sectional view of a semiconductor light emitting device taken along line VIII-VIII' of FIG. 1.

FIG. 7 is a plan view schematically illustrating a semiconductor light emitting device including a nanoscale light emitting structure according to an exemplary embodiment. FIG. 8 is a schematic cross-sectional view of a semiconductor light emitting device taken along line VIII-VIII' of FIG. 1.

A capping layer 370, as illustrated in FIG. 8, is omitted from FIG. 7, to allow for a clearer understanding of the exemplary embodiment shown in FIG. 7.

With reference to FIGS. 7 and 8, a semiconductor light emitting device 300 includes a substrate 310, a first conductivity-type semiconductor base layer 330 formed on the substrate 310, an insulating layer 340, a nanoscale light emitting structure 350, an electrode 360 and a capping layer 370. The nanoscale light emitting structure 350 includes a first conductivity-type semiconductor core 352 grown from the first conductivity-type semiconductor base layer 330, an active layer 354 and a second conductivity-type semiconductor layer 356. The semiconductor light emitting device 300 further includes a buffer layer 320 disposed between the substrate 310 and the first conductivity-type semiconductor base layer 330.

In the exemplary embodiment, the nanoscale light emitting structure 350 includes a nanowall structure extended in a single direction along a single surface of the semiconductor light emitting device 300, unlike in the semiconductor light emitting device 100 shown in FIGS. 1 and 2. Specifically, the nanoscale light emitting structures 350 each have a frustum of quadrangular pyramid shape as shown in FIG. 8. In this exemplary embodiment, a current concentration phenomenon can be relieved as compared to a case in which the nanoscale light emitting structure 350 has a cone shape. The nanoscale light emitting structure 350 may have a pyramid shape extending in a single direction, a regular parallelepiped shape or a rectangular parallelepiped shape according to an embodiment.

The electrode 360 is electrically connected to the second conductive semiconductor layer 356 and may be formed to have a height lower than those of the nanoscale light emitting structures 350, between the nanoscale light emitting structures 350. Thus, the nanoscale light emitting structures 350 each protrude upwardly of the electrode 360 by a predetermined distance. A protruding height of the nanoscale light emitting structures 350 may vary according to an embodiment.

According to an exemplary embodiment, the electrode 360 is formed to have a height lower than those of the nanoscale light emitting structures 350 and a predetermined thickness on sidewalls of the nanoscale light emitting structures 350, such that an upper surface is not flat, that is, may have a concave portion thereon instead of having a flat upper surface as shown in FIG. 8. In addition, according to another exemplary embodiment, the electrode 360 may have only a connective form between the nanoscale light emitting structures 350 adjacent to each other in portions thereof.

As in the present exemplary embodiment, the electrode 360 is formed to expose upper portions of the nanoscale light emitting structures 350, thereby preventing a current concentration phenomenon occurring in upper regions 350V of the nanoscale light emitting structures 350 due to a three dimensional shape of the nanoscale light emitting structure 350.

FIGS. 9A to 9D are schematic cross-sectional views illustrating a method of fabricating a semiconductor light emitting device having a nanoscale light emitting structure according to an exemplary embodiment. In detail, although FIGS. 9A to 9D illustrate a process of fabricating the semiconductor light emitting device shown in FIGS. 1 and 2, a semiconductor light emitting device shown in FIGS. 3 to 8 may also be fabricated in a scheme similar thereto.

Figure 9A:
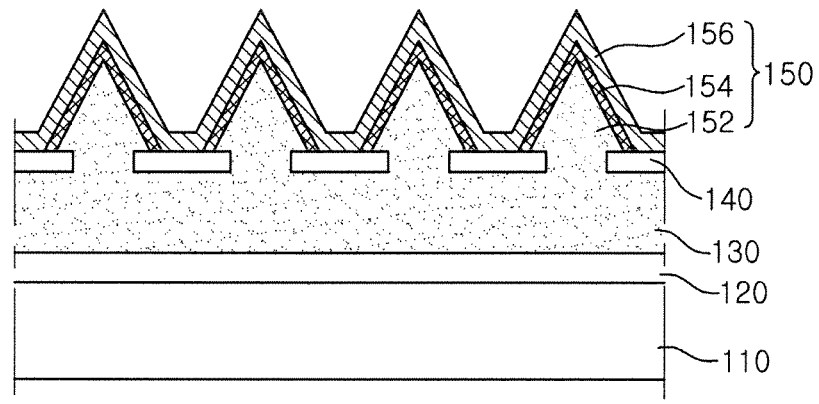
FIGS. 9A to 9D are schematic cross-sectional views illustrating a method of fabricating a semiconductor light emitting device having a nanoscale light emitting structure according to an exemplary embodiment.

With reference to FIG. 9A, a buffer layer 120, a first conductivity-type semiconductor base layer 130, an insulating layer 140 and a nanoscale light emitting structure 150 are formed on a substrate 110.

The buffer layer 120 and the first conductivity-type semiconductor base layer 130 may first be grown on the substrate 110 using a process such as metal organic chemical vapor deposition (MOCVD), hydride vapor phase epitaxy (HYPE), or the like. Subsequently, the insulating layer 140 having a plurality of insulator openings formed therein is formed, and a first conductivity-type semiconductor core 152, an active layer 154 and a second conductivity-type semiconductor layer 156 are sequentially grown on the first conductivity-type semiconductor base layer 130 exposed to the insulator openings.

Figure 9B:
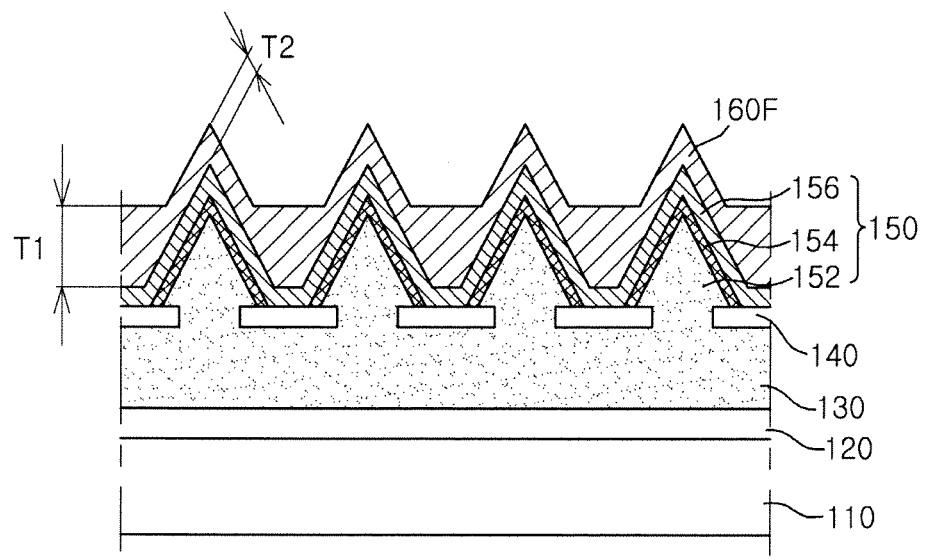

Referring to FIG. 9B, an electrode layer 160F is formed on the second conductivity-type semiconductor layer 156. For example, the electrode layer 160F may be deposited using physical vapor deposition (PVD) such as sputtering and electron beam evaporator.

The electrode layer 160F may be formed so as not to be conformal, that is, to have an uneven thickness on the nanoscale light emitting structure 150 by adjusting deposition conditions. That is, as shown in FIG. 9B, the electrode layer 160F has a first thickness T1 between adjacent nanoscale light emitting structures 150 and has a second thickness T2, less than the first thickness T1, on a side portion of upper part of the nanoscale light emitting structure 150.

Figure 9C:
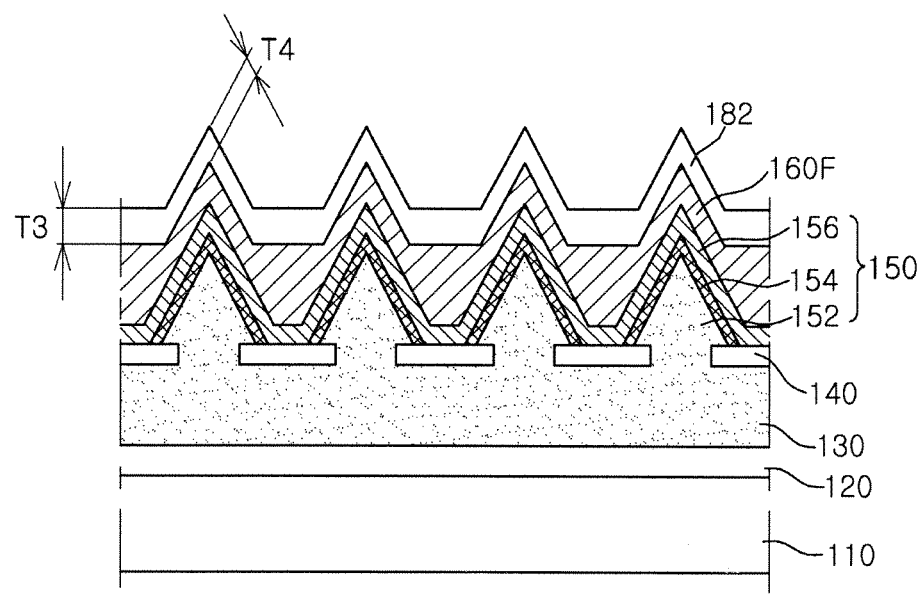

With reference to FIG. 9C, a sacrificial layer 182 can be formed on the electrode layer 160F. The sacrificial layer 182 may be formed of a material having the same etching rate as or etching rate similar to that of the electrode layer 160F, but should not be construed as being limited thereto. The sacrificial layer 182 has a third thickness T3 on the electrode layer 160F between adjacent nanoscale light emitting structures 150 and has a fourth thickness T4 on the electrode layer 160F provided on the side portion of the nanoscale light emitting structure 150. The fourth thickness T4 may be the same as or less than the third thickness T3.

The present process of forming the sacrificial layer 182 may be an optional process and can be omitted according to an embodiment.

Figure 9D:
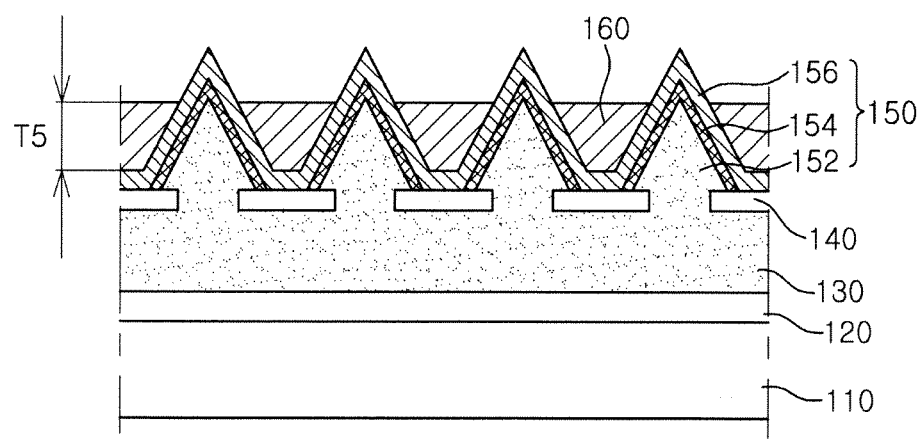

With reference to FIG. 9D, a process in which the sacrificial layer 182 and the electrode layer 160F having the second thickness T2 (see FIG. 9B) formed along the side portions of the nanoscale light emitting structures 150 are removed may be performed. The removal process may be performed by wet etching or dry etching. In the removal process described above, the sacrificial layer 182 formed between the nanoscale light emitting structures 150 may be entirely removed while all of the sacrificial layer 182 and the electrode layer 160F formed on the side portions of the nanoscale light emitting structures 150 are removed, and the electrode layer 160F formed between the nanoscale light emitting structures 150 may not be removed or may be partially removed.

As shown in FIG. 9D, the electrode 160 has a height lower than those of the nanoscale light emitting structures 150. The thickness T5 of the electrode 160 may be identical to or less than the first thickness T1 (see FIG. 9B) of the electrode layer 160F, and the fifth thickness T5 may vary depending on a thickness and a material of the sacrificial layer 182, etching conditions, and the like.

Subsequently, as in reference to FIG. 2, a process of forming the capping layer 170 on the nanoscale light emitting structures 150 and the electrode 160 may be performed. Next, processes for forming pad electrodes not shown in the drawing may be further performed.

Figure 10A:
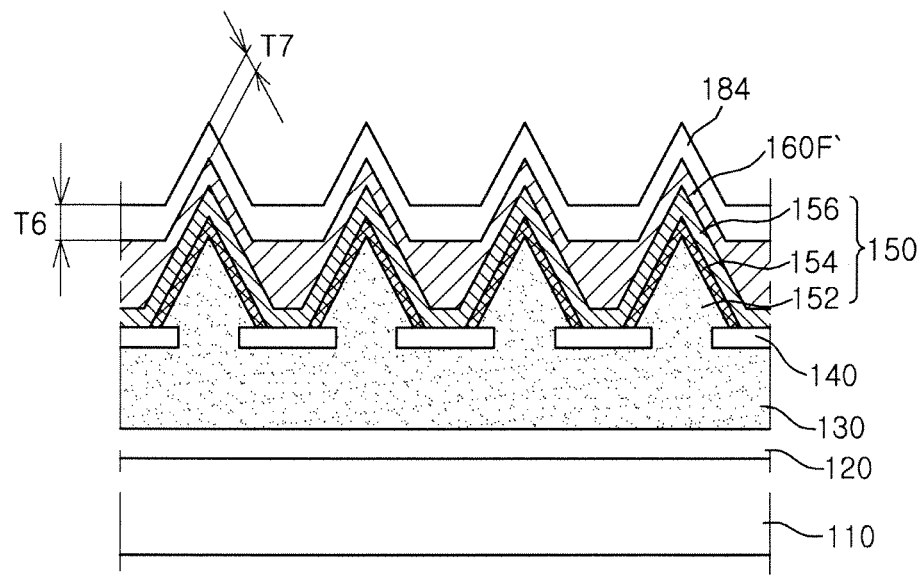
FIGS. 10A to 10C are schematic cross-sectional views illustrating a method of fabricating a semiconductor light emitting device having a nanoscale light emitting structure according to an exemplary embodiment.
Figure 10B:
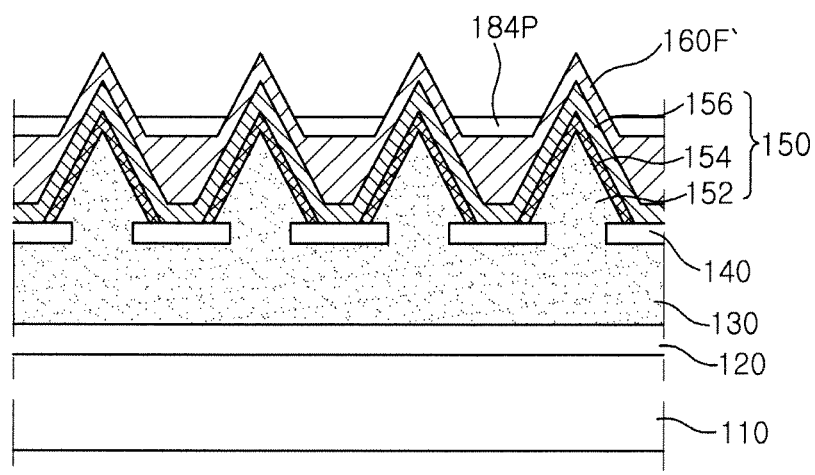
Figure 10C:
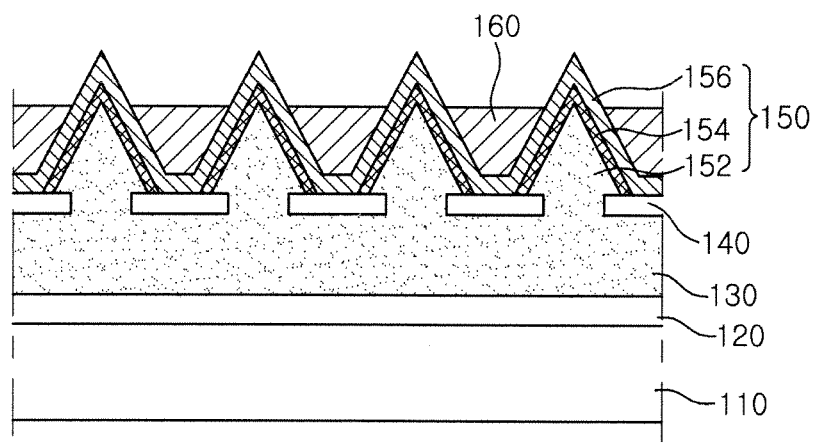

FIGS. 10A to 10C are schematic cross-sectional views illustrating a method of fabricating a semiconductor light emitting device having a nanoscale light emitting structure according to an exemplary embodiment.

Referring to FIG. 10A, a process in which the buffer layer 120, the first conductivity-type semiconductor base layer 130, the insulating layer 140, the nanoscale light emitting structure 150 and the electrode layer 160F described above with reference to FIGS. 9A and 9B are formed may be performed.

Thereafter, a mask layer 184 is formed on the electrode layer 160F. The mask layer 184 may be a photoresist layer, and specifically, may be formed of a photoresist having relatively low viscosity. The mask layer 184 is formed to have a sixth thickness T6 on the electrode layer 160F between adjacent nanoscale light emitting structures 150, and is formed to have a seventh thickness T7 less than the sixth thickness T6, on the electrode layer 160F provided on the side portions of the nanoscale light emitting structures 150 on the upper part of the nanoscale light emitting structure 150, by spin-coating a material having relatively low viscosity thereon.

With reference to FIG. 10B, a process of forming a mask pattern 184P can be performed. In the exemplary embodiment, the mask layer 184 is exposed by adjusting an exposure time so as to only be exposed from an upper surface of the mask layer 184 to a depth corresponding to the seventh thickness T7, and a developing process is then be performed. Therefore, only the mask layer 184 remain at a predetermined thickness between the nanoscale light emitting structures 150 to thereby form the mask pattern 184P, as shown in FIG. 10B.

With reference to FIG. 10C, a process of forming the electrode 160 by removing an electrode layer 160F' which is exposed through the mask pattern 184P is performed. The electrode 160 having a height lower than those of the nanoscale light emitting structures 150 is thus be formed in the present exemplary embodiment.

In the process described above, the semiconductor light emitting devices 100a and 100b with reference to FIGS. 3 and 4 can be fabricated based on an etched extent of the electrode layer 160F' located on a side portion of the mask pattern 184P. For example, when the etching is performed such that a majority of the electrode layer 160F' located on the side portion of the mask pattern 184P remains, the semiconductor light emitting device 100a as illustrated in FIG. 3 can be fabricated, and in a case in which the electrode layer 160F' positioned on the side portion of the mask pattern 184P is excessively etched, the semiconductor light emitting device 100b as illustrated in FIG. 4 can be fabricated.

Then, afterwards, a process of removing the mask pattern 184P can be performed.

Subsequently, as illustrated in FIG. 2, the capping layer 170 can be formed on the nanoscale light emitting structures 150 and the electrode 160. Further, pad electrodes not shown in the drawing can be further formed.

Figure 11:
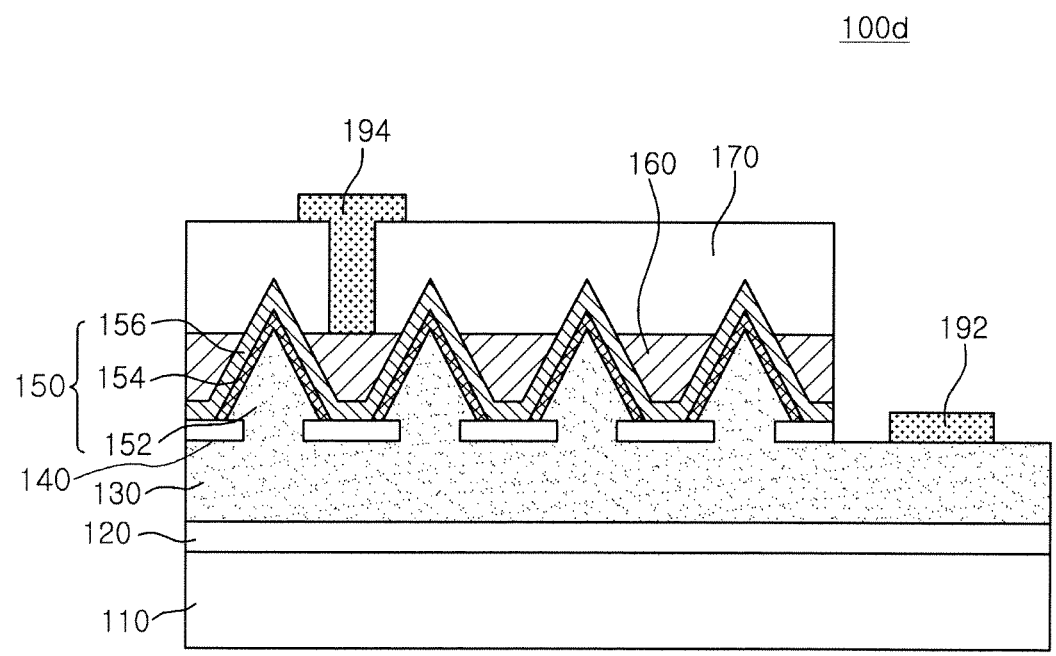
FIG. 11 is a schematic cross-sectional view of a semiconductor light emitting device having a nanoscale light emitting structure according to an exemplary embodiment.

FIG. 11 is a schematic cross-sectional view of a semiconductor light emitting device having a nanoscale light emitting structure according to an exemplary embodiment.

A semiconductor light emitting device 100d shown in FIG. 11 has the same constituent elements as those of the semiconductor light emitting device 100 shown in FIG. 2 except for a configuration in which a first pad electrode and a second pad electrode 192 and 194 are additionally formed on the semiconductor light emitting device 100 shown in FIG. 2.

Referring to FIG. 11, the semiconductor light emitting device 100d includes a substrate 110, a buffer layer 120 formed on the substrate 110, a first conductivity-type semiconductor base layer 130, an insulating layer 140, a nanoscale light emitting structure 150, an electrode 160, a capping layer 170, and a first pad electrode 192 and a second pad electrode 194.

The first pad electrode and the second pad electrode 192 and 194 are electrically connected to the first conductivity-type semiconductor layer 130 and the electrode 160, respectively.

The first pad electrode 192 is disposed on the first conductivity-type semiconductor base layer 130 exposed by partially etching the capping layer 170, the electrode 160, the nanoscale light emitting structure 150 and the insulating layer 140. According to another exemplary embodiment, the capping layer 170 may also be formed on the first pad electrode 192.

The second pad electrode 194 is formed to be connected directly to the electrode 160 by partially etching the capping layer 170, as shown in FIG. 11.

The exemplary embodiment describes a horizontal structure semiconductor light emitting device, but is not limited thereto, but may be applied to various structures of semiconductor light emitting devices such as a flip-chip type semiconductor light emitting device or the like. In the case of the flip-chip type semiconductor light emitting device, the capping layer 170 may contain a light reflective material.

Figure 12:
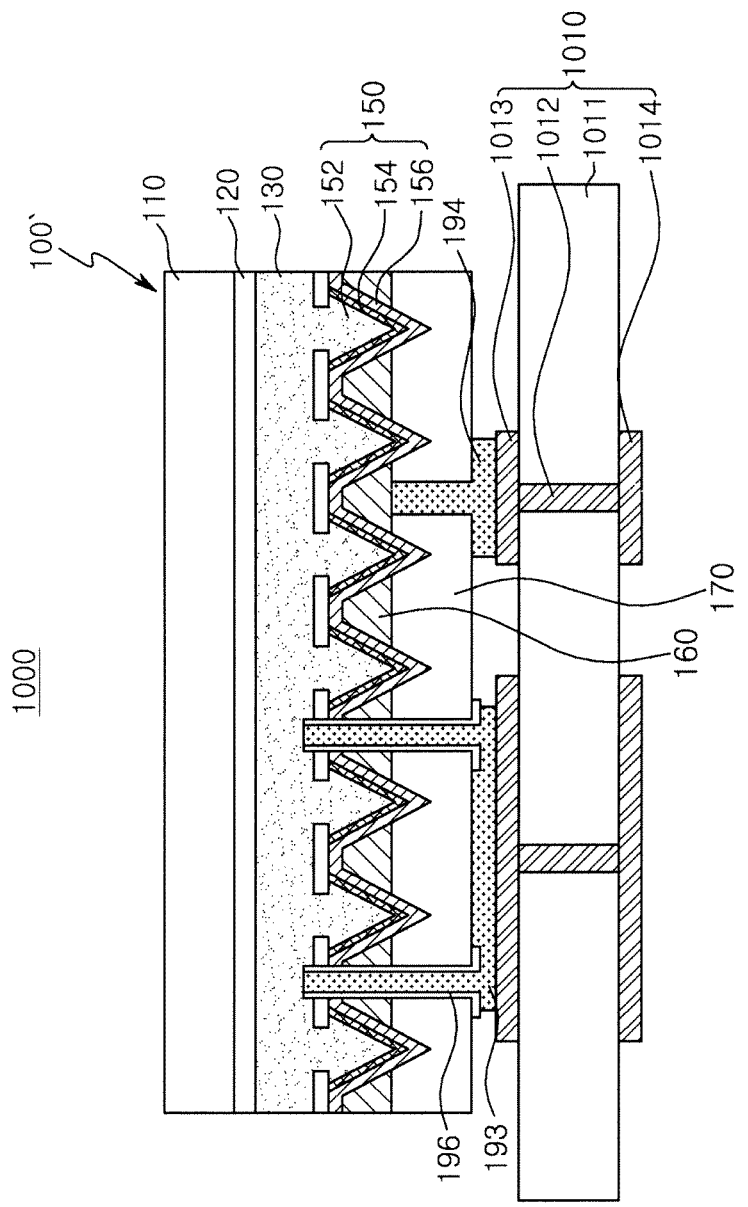
FIG. 12 illustrates an example of a semiconductor light emitting device applied to a semiconductor light emitting device package according to an exemplary embodiment.

FIG. 12 illustrates an example of a semiconductor light emitting device applied to a semiconductor light emitting device package according to an exemplary embodiment.

With reference to FIG. 12, a light emitting device package 1000 according to the exemplary embodiment includes a mounting substrate 1010 and a semiconductor light emitting device 100' mounted on the mounting substrate 1010, and the semiconductor light emitting device 100' includes a structure similar to the structure described with reference to FIGS. 1 to 8, and FIG. 11.

In the exemplary embodiment, the semiconductor light emitting device 100' includes a first pad electrode and a second pad electrode 193 and 194, and the first pad electrode and the second pad electrode 193 and 194 are electrically connected to the first conductivity-type semiconductor base layer 130 and the electrode 160, respectively. An electrode insulating layer 196 for insulation of electrode may be disposed between the second conductivity-type semiconductor layer 156 and the electrode layer 160, and the first pad electrode 193. The size, number and location of the first pad electrode and the second pad electrode 193 and 194 can vary according to an embodiment.

According to other embodiments, the substrate 110 may be removed and omitted. A wet or dry etching or a laser lift-off (LLO) process may be used in removing the substrate 110. In the case in which the substrate 110 is removed, the substrate 110 can be entirely removed or partially removed. In addition, although not specifically illustrated, the light extraction efficiency may be improved by forming a concave-convex portion in a surface of the first conductivity-type semiconductor base layer 130 or the substrate 110.

In the exemplary embodiment, the mounting substrate 1010 includes a substrate body 1011, at least one upper surface electrode 1013 and at least one lower surface electrode 1014. In addition, the mounting substrate 1010 includes a through-electrode 1012 connecting the upper surface electrode 1013 to the lower surface electrode 1014. Such a structure of the mounting substrate 1010 is only an example and the mounting substrate 1010 can take various forms of structures. Further, the mounting substrate 1010 may be provided as a ceramic substrate formed of MN, $Al_2O_3$, or the like, may be provided as a substrate such as a printed circuit board (PCB), a metal-core printed circuit board (MCPCB, MPCB, a flexible printed circuit board (FPCB), or the like, or may be provided in the form of a package lead frame. Specifically, in the exemplary embodiment, in a case in which the mounting substrate 1010 is a transparent substrate including a transparent insulating material and a transparent conductive material such as ITO or ZnO, light from the semiconductor light emitting device 100' may be emitted in both directions, that is, upward and downward directions of the light emitting device package 1000.

The first pad electrode and the second pad electrode 193 and 194 of the semiconductor light emitting device 100' are electrically connected to different upper surface electrodes 1013 of the mount substrate 1010, respectively.

Although not shown in the drawing, a wavelength conversion layer may encompass the semiconductor light emitting device 100' and may convert a wavelength of light emitted from the semiconductor light emitting device 100' into a different wavelength thereof. The wavelength conversion layer may contain a phosphor, a quantum dot, or the like.

Figure 13:
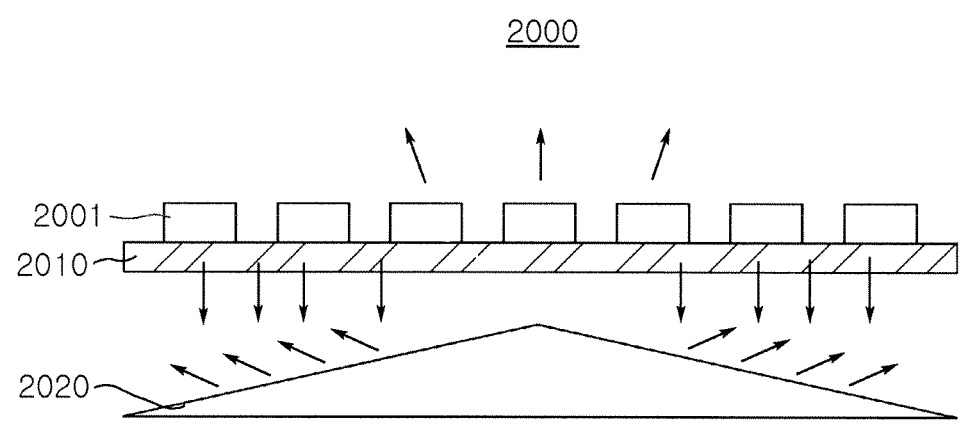
FIG. 13 illustrates an example of a semiconductor light emitting device applied to an illumination apparatus according to an exemplary embodiment.

FIG. 13 illustrates an example of a semiconductor light emitting device applied to an illumination apparatus according to an embodiment.

FIG. 13 illustrates an illumination apparatus 2000 including a mounting substrate 2010, at least one light source 2001 mounted on the mounting substrate 2010, and a reflective part 2020 disposed in a lower part thereof. A plurality of light sources 2001 may be provided using the light emitting device packages each having the structure described above with reference to FIG. 12 or a structure similar thereto, and further, may also be provided by directly mounting the semiconductor light emitting device shown in FIGS. 1 to 8 or in FIG. 11 on the substrate 2010 (in a so-called chip on board (COB) mounting manner).

The mounting substrate 2010 may be a transparent substrate containing a transparent conductive material and a transparent insulating material and may emit light in both directions, that is, upward and downward directions of the light source 2001.

The reflective part 2020 is an optional configuration and may serve to change a path of light emitted toward the lower part of the light source 2001. A range of distribution of light emitted from the illumination apparatus 2000 may be adjusted using the reflective part 2020. The reflective part 2020 can also be disposed above the light source 2001 according to another embodiment.

Figure 14:
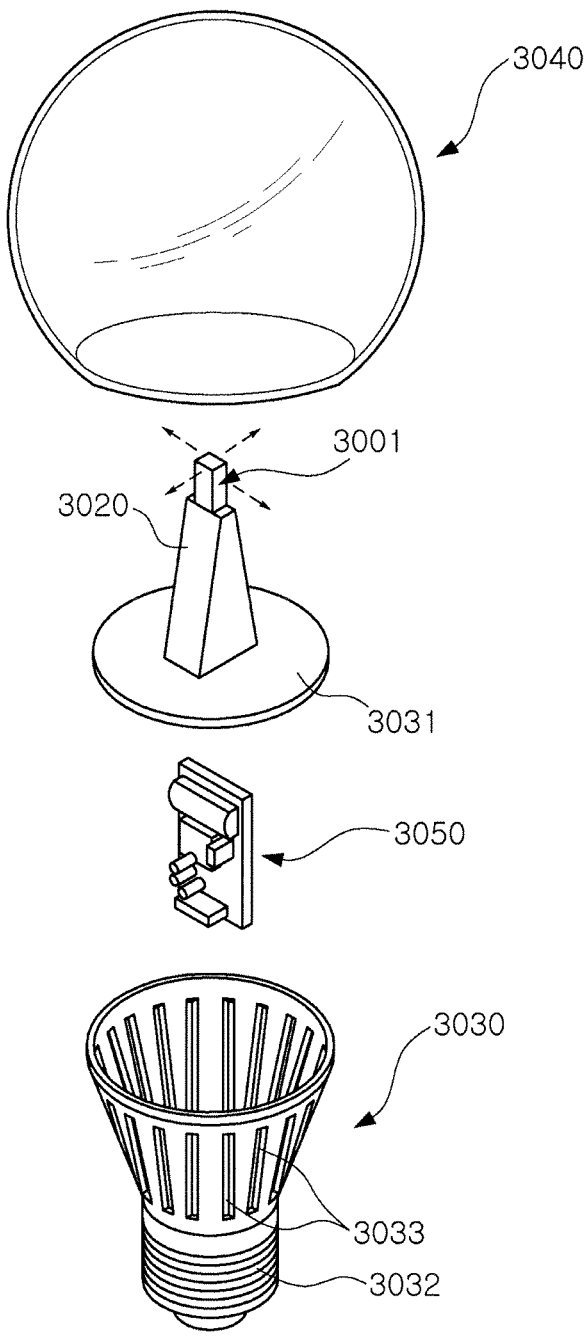
FIG. 14 illustrates an example of a semiconductor light emitting device applied to an illumination apparatus according to an exemplary embodiment.

FIG. 14 illustrates an example of a semiconductor light emitting device applied to an illumination apparatus according to an exemplary embodiment.

With reference to FIG. 14, an illumination apparatus 3000 is a bulb-type lamp and includes a light source 3001, a support part 3020 and a body part 3030, and further includes a cover part 3040 protecting the light source 3001 and the support part 3020.

The light source 3001 can be formed as a single chip structure of the semiconductor light emitting device shown in FIGS. 1 to 8, or FIG. 11, or may be formed as a multi-chip structure. The support part 3020 serves as a mounting substrate having the light source 3001 disposed thereon and supporting the light source 3001, and may receive heat generated from the light source 3001 to emit the light to the outside. Therefore, the support part 3020 is formed of a metal having excellent thermal conductivity. The light source 3001 is mounted on an upper surface of the support part 3020 to be perpendicular with regard to the upper surface of the support part 3020. In detail, the light source 3001 may be vertically mounted such that one lateral part of the substrate 110 and the nanoscale light emitting structure 150 on the substrate 110 of FIG. 2 face the upper surface of the support part 3020. The light source 3001 is electrically connected to a circuit wiring provided with the support part 3020 through a scheme such as flip-chip bonding, wire bonding or the like.

As such, in the case of the structure in which the light source 3001 is vertically mounted, the mounting thereof may be carried out without packing a semiconductor light emitting device, unlike the structure according to the related art in which the mounting is performed by mounting a light emitting device package. Therefore, illumination can be simultaneously provided to a rearward region as well as a forward region, such that excellent beam characteristics, such as those of a filament-based lighting device according to the related art, can be exhibited. Although the present embodiment illustrates the form in which a single light source 3001 is mounted on the support part 3020, a plurality of light sources can be mounted as needed. In an example of variation of the exemplary embodiment, the light source 3001 can be a light emitting device package as shown in FIG. 12.

In the exemplary embodiment, the body part 3030 is a housing member having an internal space of a predetermined size and includes a heat emission plate 3031 directly connected to the support part 3020 to improve heat radiation efficiency. The body part 3030 may be provided with the support part 3020 fastened to an upper part thereof. A lower part of the body part 3030 may be provided with an external connection part 3032 connected to external power. The body part 3030 include, therein, a driving unit 3050 connected to the external connection part 3032 having, for example, a socket structure, to receive power from the external power and drive the light source 3001. The driving unit 3050 is configured of an alternating current to digital current (AC to DC) converter, a rectifying circuit component, or the like.

The body part 3030 includes a radiating unit 3033 provided with an outer surface, which emits heat transferred through the support part 3020 to the outside. For example, the radiating unit 3033 includes a hole formed through a peripheral surface of the body part 3030 being penetrated so as to directly emit heat from within the body part 3030 to the outside, but should not be construed as being limited thereto. That is, the radiating unit 3033 may include one or more radiating fins protruding from a side portion of the body part 3030.

The cover part 3040 is fastened to an upper part of the body part 3030 to protect the light source 3001 and the support part 3020. The cover part 3040 may be formed of a transparent material, for example, glass or a resin, and may have a convex bulb shape. The cover part 3040 further includes a wavelength conversion layer (not shown) containing a phosphor to convert a wavelength of light emitted from the light source 3001 into a different wavelength of light.

As set forth above, according to the various exemplary embodiments provided herein of the inventive concept, a semiconductor light emitting device having improved reliability by preventing a current from being concentrated on a nanoscale light emitting structure, and an illumination apparatus having the same, are provided.

A semiconductor light emitting device capable of performing simultaneous bidirectional light emission in forward and backward directions to have improved light distribution characteristics, and an illumination apparatus having the same, are provided.

While the inventive concept has been shown and described in connection with the exemplary embodiments described herein, it will be apparent to those skilled in the art that modifications and variations could be made without departing from the spirit and scope of the present inventive concept as defined by the appended claims.

What is claimed is:

1. A semiconductor light emitting device comprising:
   a first conductivity-type semiconductor base layer;
   a plurality of nanoscale light emitting structures spaced apart from one another on the first conductivity-type semiconductor base layer, the plurality of nanoscale light emitting structures each including a first conductivity-type semiconductor core, an active layer and a second conductivity-type semiconductor layer; and
   an electrode connected to the second conductivity-type semiconductor layer, wherein the electrode is disposed between the plurality of nanoscale light emitting structures surrounding each of the plurality of nanoscale light emitting structures, and the electrode has a height lower than a height of the plurality of nanoscale light emitting structures,
   wherein the electrode extends from a surface of one nanoscale light emitting structure to a surface of another nanoscale light emitting structure.

2. The semiconductor light emitting device of claim 1, wherein upper parts of the plurality of nanoscale light emitting structures protrude upward above the electrode.

3. The semiconductor light emitting device of claim 1, wherein the plurality of nanoscale light emitting structures each have inclined side portions such that upper parts of the nanoscale light emitting structures have gradually reduced cross sections, and the electrode covers portions of the inclined side portions of the plurality of nanoscale light emitting structures.

4. The semiconductor light emitting device of claim 1, further comprising a capping layer disposed on the plurality of nanoscale light emitting structures and the electrode.

5. The semiconductor light emitting device of claim 4, wherein at least a portion of light generated from the active layer is emitted in an upward direction of the plurality of nanoscale light emitting structures through the capping layer.

6. The semiconductor light emitting device of claim 4, wherein the capping layer includes one of $SiO_2$, SiN, $Al_2O_3$, HfO, $TiO_2$ or ZrO.

7. The semiconductor light emitting device of claim 1, wherein the light generated from the active layer is emitted in both upward and downward directions of the plurality of nanoscale light emitting structures.

8. The semiconductor light emitting device of claim 1, further comprising:
   a substrate disposed below the first conductivity-type semiconductor base layer; and
   an insulating layer disposed on the first conductivity-type semiconductor base layer and having a plurality of insulator openings formed therein, exposing the first conductivity-type semiconductor base layer,
   wherein the plurality of nanoscale light emitting structures are disposed on the plurality of insulator openings.

9. The semiconductor light emitting device of claim 1, wherein the plurality of nanoscale light emitting structures each have a hexagonal pyramid shape or a hexagonal prism shape.

10. The semiconductor light emitting device of claim 1, wherein the plurality of nanoscale light emitting structures each have a frustum of pyramid shape extending in a single direction.

11. The semiconductor light emitting device of claim 1, wherein a thickness of the electrode in a region adjacent to the second conductivity-type semiconductor layer is thicker or thinner than that in a region in central portion of the electrode.

12. An illumination apparatus comprising:
   a semiconductor light emitting device including:
      a substrate;
      a first conductivity-type semiconductor base layer disposed on the substrate;
      a plurality of nanoscale light emitting structures spaced apart from one another on the first conductivity-type semiconductor base layer, the plurality of nanoscale light emitting structures each comprising a first conductivity-type semiconductor core, an active layer and a second conductivity-type semiconductor layer; and
      an electrode connected to the second conductivity-type semiconductor layer, wherein the electrode is disposed between the plurality of nanoscale light emitting structures surrounding each of the plurality of nanoscale light emitting structures, and the electrode includes a height lower than a height of the plurality of nanoscale light emitting structures; and
   a mounting substrate on which the semiconductor light emitting device is to be mounted,
   wherein light from the semiconductor light emitting device is emitted bidirectionally, in upward and downward directions of the semiconductor light emitting device, and
   wherein the electrode extends from a surface of one nanoscale light emitting structure to a surface of another nanoscale light emitting structure.

13. The illumination apparatus of claim 12, further comprising a reflective part disposed above or below the semiconductor light emitting device, wherein the reflective part is configured to alter a path of light emitted from the semiconductor light emitting device.

14. The illumination apparatus of claim 12, wherein the mounting substrate is formed of a transparent material.

15. The illumination apparatus of claim 12, wherein the semiconductor light emitting device is vertically mounted on the mounting substrate such that the substrate is perpendicular with regard to the mounting substrate.

16. A light emitting device comprising:
   a plurality of nanoscale light emitting structures each comprising a first conductivity-type semiconductor core, an active layer, and a second conductivity-type semiconductor layer; and an electrode disposed between the plurality of nanoscale light emitting structures surrounding each of the plurality of nanoscale light emitting structures, wherein the electrode is connected to the second conductivity-type semiconductor layer and peaks of the plurality of nanoscale light emitting structures lie above the electrode, wherein the electrode extends from a surface of one nanoscale light emitting structure to a surface of another nanoscale light emitting structure.

17. The light emitting device of claim 16, wherein the plurality of nanoscale light emitting structures each have inclined side portions such that upper parts of the plurality of nanoscale light emitting structures have triangular cross sections thereof.

18. The light emitting device of claim 16, wherein light generated from the active layer is emitted in both upward and downward directions of the nanoscale light emitting structures.

19. The light emitting device of claim 16, further comprising:
an insulating layer including a plurality of insulator openings, wherein the plurality of nanoscale light emitting structures are disposed on the plurality of insulator openings.

20. The light emitting device of claim 19, further comprising:
a capping layer disposed on the plurality of nanoscale light emitting structures and the electrode.

* * * * *